United States Patent
Cavallaro

(10) Patent No.: US 9,813,044 B2
(45) Date of Patent: Nov. 7, 2017

(54) HIGH GAIN FILTER CIRCUIT WITH AN ACCURATE TRANSFER FUNCTION

(71) Applicant: STMicroelectronics S.r.l., Agrate Brianza (IT)

(72) Inventor: Marco Orazio Cavallaro, Catania (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 15/014,260

(22) Filed: Feb. 3, 2016

(65) Prior Publication Data

US 2017/0222626 A1 Aug. 3, 2017

(51) Int. Cl.
*H03B 1/00* (2006.01)
*H03H 11/04* (2006.01)

(52) U.S. Cl.
CPC ..... *H03H 11/0427* (2013.01); *H03H 11/0422* (2013.01)

(58) Field of Classification Search
CPC .............. H03H 11/0427; H03H 11/0422
USPC ................................... 327/551–559
See application file for complete search history.

(56) References Cited

U.S. PATENT DOCUMENTS

| 5,699,016 A * | 12/1997 | Federspiel ........... H03H 11/126 330/260 |
| 5,982,232 A * | 11/1999 | Rogers .................... H03F 3/087 330/308 |
| 2002/0070770 A1* | 6/2002 | Ferianz ..................... H03F 1/34 327/108 |
| 2012/0196555 A1* | 8/2012 | Igarashi .................. H04B 1/30 455/341 |

OTHER PUBLICATIONS

Chiang, et al: "A CMOS Fully-Balanced Continuous-Time IFLK Filter Design for Read/Write Channels," IEEE 1996, pp. 167-170.

* cited by examiner

*Primary Examiner* — Thomas Skibinski
(74) *Attorney, Agent, or Firm* — Gardere Wynne Sewell LLP

(57) ABSTRACT

An active high gain filter includes high value resistances in feedback implemented using a negative resistance circuit configuration. The high value resistance is implemented using two or smaller resistances connected in the negative resistance circuit configuration. This implementation permits integration of the filter circuit using less occupied area while still providing an accurate transfer function response.

23 Claims, 5 Drawing Sheets

HIGH GAIN FILTER CIRCUIT WITH AN ACCURATE TRANSFER FUNCTION

TECHNICAL FIELD

The present invention relates to filter circuits.

BACKGROUND

Since the early days of microminiaturization, the design and implementation of filters has presented special problems relating to the difficulty in miniaturizing conventional LCR (inductor-capacitor-resistor) filters for integration on a chip. In particular, integrating the inductor component has proven to be a difficult challenge. Thus, there has been a preference for the use of inductor-less alternatives to LCR filters that are compatible with microminiaturization and on-chip integration. This continues to be necessary because, in spite of the "digital revolution," the so-called "analog front end" (AFE) of most electronic devices, which interface with the real world, is and will continue to be, analog.

The design of high-accuracy analog circuits is becoming more difficult with current mixed-signal integrated circuits because of the scaling down of both circuit supply voltages and transistor channel lengths. Most of these circuits require the use of high performance active filters. For example, radio-frequency (RF) transceivers make use of high gain filters at the intermediate frequency (IF). Indeed, the gain achievable in the early stages of the receiver is limited due to the high operation frequency. Even electronics circuits for micro-mechanical sensors (MEMS) require high gain filters. For example, high gain filters are used to evaluate the movement of mechanical parts by evaluating the charge variations in their capacitance. Unfortunately, the high value of the resistors required in the active filter in order to implement a high gain leads to a waste of circuit area and an increase in the cost of production. Furthermore, due to the dimensions of such resistors, the parasitic effects are not negligible and introduce distortion in the frequency response of the filter. Even the in-band group-delay variation could be affected.

For these reasons there is a need in the art for a new approach/topology to implement a filter with a high-gain and accurate transfer function.

Reference is now made to FIG. 1 showing a circuit diagram for a second order complex band-pass filter circuit. The topology used is referred to in the art as the leapfrog topology. The leapfrog topology is preferred because it provides for a low sensitivity to process and mismatch variation. This is important for a complex band-pass filter in order to guarantee an accurate image rejection in a frequency down conversion circuit.

The filter circuit receives a differential in-phase input signal $I_I$ and a differential quadrature-phase input signal $I_Q$. The filter circuit outputs a differential in-phase output signal $V_I$ and a differential quadrature-phase output signal $V_Q$.

The differential in-phase input signal $I_I$ is applied to the differential inputs of a first operational amplifier 10. The differential outputs of the first operational amplifier 10 are coupled to the differential inputs of the first operational amplifier through a feedback network formed by resistor R1 connected in parallel with capacitor C1. Specifically, the non-inverting output of the first operational amplifier 10 is coupled to the non-inverting input of the first operational amplifier 10 by R1 and C1 connected in parallel, while the inverting output of the first operational amplifier 10 is coupled to the inverting input of the first operational amplifier 10 by R1 and C1 connected in parallel.

The differential quadrature-phase input signal $I_Q$ is applied to the differential inputs of a second operational amplifier 12. The differential outputs of the second operational amplifier 12 are cross-coupled to the differential inputs of the second operational amplifier through a feedback network formed by resistor R2 connected in parallel with capacitor C2. Specifically, the non-inverting output of the second operational amplifier 12 is coupled to the inverting input of the second operational amplifier 12 by R2 and C2 connected in parallel, while the inverting output of the second operational amplifier 12 is coupled to the non-inverting input of the second operational amplifier 10 by R2 and C2 connected in parallel.

In a preferred implementation, R1=R2 and C1=C2.

The differential outputs of the first operational amplifier 10 are further cross-coupled to the differential inputs of the second operational amplifier 12 by resistors R3. Specifically, the non-inverting output of the first operational amplifier 10 is coupled to the inverting input of the second operational amplifier 12 by R3, while the inverting output of the first operational amplifier 10 is coupled to the non-inverting input of the second operational amplifier 12 by R3.

The differential outputs of the second operational amplifier 12 are further coupled to the differential inputs of the first operational amplifier 10 by resistors R4. Specifically, the non-inverting output of the second operational amplifier 12 is coupled to the non-inverting input of the first operational amplifier 10 by R4, while the inverting output of the second operational amplifier 12 is coupled to the inverting input of the first operational amplifier 10 by R4.

In a preferred implementation, R3=R4.

The differential outputs of the first operational amplifier 10 are further cross-coupled to the differential inputs of a third operational amplifier 14 by resistors R5. Specifically, the non-inverting output of the first operational amplifier 10 is coupled to the inverting input of the third operational amplifier 14 by R5, while the inverting output of the first operational amplifier 10 is coupled to the non-inverting input of the third operational amplifier 14 by R5.

The differential outputs of the second operational amplifier 12 are further cross-coupled to the differential inputs of a fourth operational amplifier 16 by resistors R6. Specifically, the non-inverting output of the second operational amplifier 12 is coupled to the inverting input of the fourth operational amplifier 16 by R6, while the inverting output of the second operational amplifier 12 is coupled to the non-inverting input of the fourth operational amplifier 16 by R6.

In a preferred implementation, R5=R6.

The differential outputs of the third operational amplifier 14 (at the differential in-phase output signal $V_I$) are coupled to the differential inputs of the third operational amplifier through a feedback network formed by resistor R7 connected in parallel with capacitor C3. Specifically, the non-inverting output of the third operational amplifier 14 is coupled to the non-inverting input of the third operational amplifier 14 by R7 and C3 connected in parallel, while the inverting output of the third operational amplifier 14 is coupled to the inverting input of the third operational amplifier 14 by R7 and C3 connected in parallel.

The differential outputs of the fourth operational amplifier 16 (at the differential quadrature-phase output signal $V_Q$) are cross-coupled to the differential inputs of the fourth operational amplifier through a feedback network formed by resistor R8 connected in parallel with capacitor C4. Specifically, the non-inverting output of the fourth operational amplifier 16 is coupled to the inverting input of the fourth operational amplifier 16 by R8 and C4 connected in parallel, while the inverting output of the fourth operational amplifier 16 is coupled to the non-inverting input of the fourth operational amplifier 16 by R8 and C4 connected in parallel.

In a preferred implementation, R7=R8 and C3=C4.

The differential outputs of the third operational amplifier 14 (at the differential in-phase output signal $V_I$) are further coupled to the differential inputs of the first operational amplifier 10 through a feedback network formed by resistors R9. Specifically, the non-inverting output of the third operational amplifier 14 is coupled to the non-inverting input of the first operational amplifier 10 by R9, while the inverting output of the third operational amplifier 14 is coupled to the inverting input of the first operational amplifier 10 by R9.

The differential outputs of the fourth operational amplifier 16 (at the differential quadrature-phase output signal $V_Q$) are further cross-coupled to the differential inputs of the second operational amplifier 12 through a feedback network formed resistors R10. Specifically, the non-inverting output of the fourth operational amplifier 16 is coupled to the inverting input of the second operational amplifier 12 by R10, while the inverting output of the fourth operational amplifier 16 is coupled to the non-inverting input of the second operational amplifier 12 by R10.

In a preferred implementation, R9=R10.

The differential outputs of the third operational amplifier 14 are further cross-coupled to the differential inputs of the fourth operational amplifier 16 by resistors R11. Specifically, the non-inverting output of the third operational amplifier 14 is coupled to the inverting input of the fourth operational amplifier 16 by R11, while the inverting output of the third operational amplifier 14 is coupled to the non-inverting input of the fourth operational amplifier 16 by R11.

The differential outputs of the fourth operational amplifier 16 are further coupled to the differential inputs of the third operational amplifier 14 by resistors R12. Specifically, the non-inverting output of the fourth operational amplifier 16 is coupled to the non-inverting input of the third operational amplifier 14 by R12, while the inverting output of the fourth operational amplifier 16 is coupled to the inverting input of the third operational amplifier 14 by R12.

In a preferred implementation, R11=R12.

Consider the filter specifications as shown in the following table:

| Parameter | Specification | unit |
|---|---|---|
| Gain | 128 | dBΩ |
| Center Frequency ($\omega_o$) | 1.33 | MHz |
| Bandwidth | 1.6 | MHz |
| Output Noise ($V_{no}$) | 700 | nV/√Hz |
| Linearity | | |
| Group Delay | 60 | ns |
| Current Consumption | 500 | µA |

The corresponding transfer function for the filter implemented as in FIG. 1 is shown in FIG. 2A. This is the transfer function considering an ideal implementation of the filter, i.e. using ideal operational amplifiers and an ideal passive network. The related group-delay for the filter implemented as in FIG. 1 is shown in FIG. 2B.

Unfortunately, in a practical implementation, ideal components are not available. Considering the design equations the value of feedback resistors R10 and R11, from input to output, it is directly proportional to the gain Go of the amplifier, i.e.:

$Go$=122 dbΩs.e. ⇒ 20 log($R10$)=122 dBΩ; $R10$=$R11$≈1.26 MΩ

The problem is that this value of resistance is very high and will have a direct impact on the area of silicon occupied by the circuit and thus the cost of the device. Furthermore, even considering use of an ideal operational amplifier, the transfer function and group delay will be distorted as shown in FIGS. 3A and 3B, respectively.

In a communication system the distortion of the transfer function could lead to a loss of information and could be unacceptable. The distortions are due to the high value and large size resistors. Indeed, even at low frequency (for example, 1.33 MHz), the parasitic effects for such high value resistors are not negligible. The maximum value usable for high resistivity poly resistors in a standard CMOS technology is limited. Hence, in order to implement a high value resistor it will be necessary to use the series connection of many polysilicon resistors. The occupied silicon area of such a resistor will be very high. Furthermore, the connection and the parasitic capacitances ($C_p$) will be not negligible. The model of such a high value resistor is shown in FIG. 4. These parasitic effects will make changes in the wanted transfer function called distortions.

Thus, there would be an advantage if the filter could be implemented using smaller value resistors while still providing for a high gain with an accurate transfer function.

SUMMARY

The present invention presents a new topology for implementing high value resistors for use, for example, in high gain filter circuits. This solution supports an accurate transfer function of the active filter and low silicon area occupation.

In an embodiment, a filter circuit comprises: a trans-impedance amplification circuit having a differential input comprising an inverting input and a non-inverting input and a differential output comprising an inverting output and a non-inverting output; a first feedback network comprising a first impedance coupled between the inverting output and the inverting input and a second impedance coupled between the inverting output and the non-inverting input; and a second feedback network comprising a third impedance coupled between the non-inverting output and the non-inverting input and a fourth impedance coupled between the non-inverting output and the inverting input.

In an embodiment, a filter circuit comprises: a differential input comprising an inverting input and a non-inverting input; a differential output comprising an inverting output and a non-inverting output; trans-impedance amplification circuitry coupled between the differential input and the differential output; and a feedback network comprising: a first resistor coupled between the inverting output and the inverting input; a second resistor coupled between the inverting output and the non-inverting input; a third resistor coupled between the non-inverting output and the non-inverting input; and a fourth resistor coupled between the non-inverting output and the inverting input.

In an embodiment, a filter circuit comprises: an in-phase differential input comprising a first inverting input and a first non-inverting input; an in-phase differential output comprising a first inverting output and a first non-inverting output; a quadrature-phase differential input comprising a second inverting input and a second non-inverting input; a quadrature-phase differential output comprising a second inverting output and a second non-inverting output; trans-impedance amplification circuitry coupled between the in-phase and quadrature-phase differential inputs and the in-phase and quadrature-phase differential outputs; a first feedback network comprising: a first resistor coupled between the first inverting output and the first inverting input; a second resistor coupled between the first inverting output and the first non-inverting input; a third resistor coupled between the first non-inverting output and the first non-inverting input; and a fourth resistor coupled between the first non-inverting output and the first inverting input; and a second feedback network comprising: a fifth resistor coupled between the second inverting output and the second inverting input; a sixth resistor coupled between the second inverting output and the second non-inverting input; a seventh resistor coupled between the second non-inverting output and the second non-inverting input; and an eighth resistor coupled between the second non-inverting output and the second inverting input.

BRIEF DESCRIPTION OF THE DRAWINGS

For a better understanding, preferred embodiments thereof are now described, purely by way of non-limiting example, with reference to the attached drawings, wherein.

DETAILED DESCRIPTION

Figure 5:
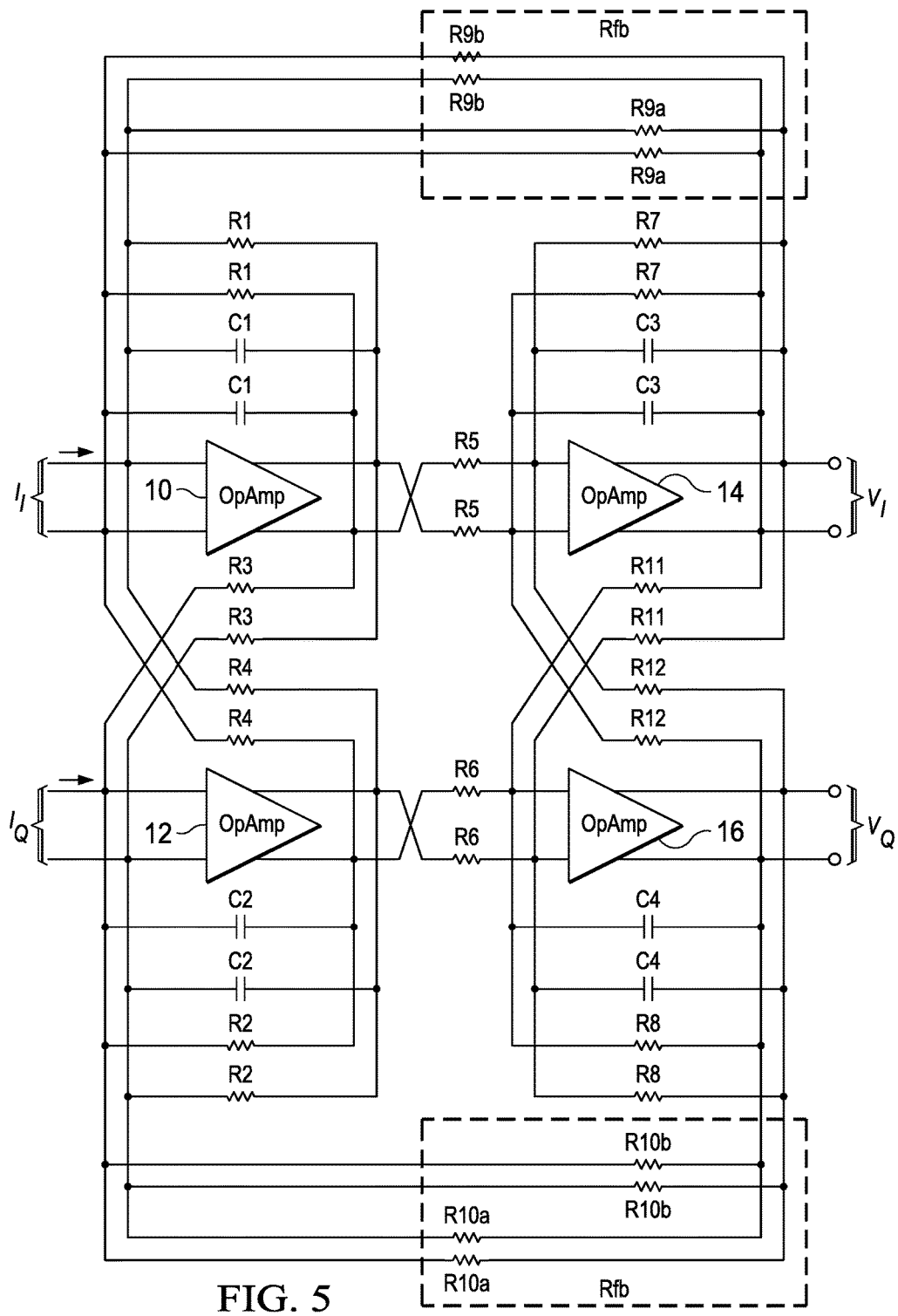
FIG. 5 is a circuit diagram for a second order complex band-pass filter circuit.

Reference is now made to FIG. 5 showing a circuit diagram for a second order complex band-pass filter circuit. The topology used is referred to in the art as the leapfrog topology. The leapfrog topology is preferred because it provides for a low sensitivity to process and mismatch variation. This is important for a complex band-pass filter in order to guarantee an accurate image rejection in a frequency down conversion circuit.

The filter circuit receives a differential in-phase input signal $I_I$ and a differential quadrature-phase input signal $I_Q$. The filter circuit outputs a differential in-phase output signal $V_I$ and a differential quadrature-phase output signal $V_Q$.

The differential in-phase input signal $I_I$ is applied to the differential inputs of a first operational amplifier 10. The differential outputs of the first operational amplifier 10 are coupled to the differential inputs of the first operational amplifier through a feedback network formed by resistor R1 connected in parallel with capacitor C1. Specifically, the non-inverting output of the first operational amplifier 10 is coupled to the non-inverting input of the first operational amplifier 10 by R1 and C1 connected in parallel, while the inverting output of the first operational amplifier 10 is coupled to the inverting input of the first operational amplifier 10 by R1 and C1 connected in parallel.

The differential quadrature-phase input signal $I_Q$ is applied to the differential inputs of a second operational amplifier 12. The differential outputs of the second operational amplifier 12 are cross-coupled to the differential inputs of the second operational amplifier through a feedback network formed by resistor R2 connected in parallel with capacitor C2. Specifically, the non-inverting output of the second operational amplifier 12 is coupled to the inverting input of the second operational amplifier 12 by R2 and C2 connected in parallel, while the inverting output of the second operational amplifier 12 is coupled to the non-inverting input of the second operational amplifier 10 by R2 and C2 connected in parallel.

In a preferred implementation, R1=R2 and C1=C2.

The differential outputs of the first operational amplifier 10 are further cross-coupled to the differential inputs of the second operational amplifier 12 by resistors R3. Specifically, the non-inverting output of the first operational amplifier 10 is coupled to the inverting input of the second operational amplifier 12 by R3, while the inverting output of the first operational amplifier 10 is coupled to the non-inverting input of the second operational amplifier 12 by R3.

The differential outputs of the second operational amplifier 12 are further coupled to the differential inputs of the first operational amplifier 10 by resistors R4. Specifically, the non-inverting output of the second operational amplifier 12 is coupled to the non-inverting input of the first operational amplifier 10 by R4, while the inverting output of the second operational amplifier 12 is coupled to the inverting input of the first operational amplifier 10 by R4.

In a preferred implementation, R3=R4.

The differential outputs of the first operational amplifier 10 are further cross-coupled to the differential inputs of a third operational amplifier 14 by resistors R5. Specifically, the non-inverting output of the first operational amplifier 10 is coupled to the inverting input of the third operational amplifier 14 by R5, while the inverting output of the first operational amplifier 10 is coupled to the non-inverting input of the third operational amplifier 14 by R5.

The differential outputs of the second operational amplifier 12 are further cross-coupled to the differential inputs of a fourth operational amplifier 16 by resistors R6. Specifically, the non-inverting output of the second operational amplifier 12 is coupled to the inverting input of the fourth operational amplifier 16 by R6, while the inverting output of the second operational amplifier 12 is coupled to the non-inverting input of the fourth operational amplifier 16 by R6.

In a preferred implementation, R5=R6.

The differential outputs of the third operational amplifier 14 (at the differential in-phase output signal $V_I$) are coupled to the differential inputs of the third operational amplifier through a feedback network formed by resistor R7 connected in parallel with capacitor C3. Specifically, the non-inverting output of the third operational amplifier 14 is coupled to the non-inverting input of the third operational amplifier 14 by R7 and C3 connected in parallel, while the inverting output of the third operational amplifier 14 is coupled to the inverting input of the third operational amplifier 14 by R7 and C3 connected in parallel.

The differential outputs of the fourth operational amplifier 16 (at the differential quadrature-phase output signal $V_Q$) are cross-coupled to the differential inputs of the fourth operational amplifier through a feedback network formed by resistor R8 connected with capacitor C4. Specifically, the non-inverting output of the fourth operational amplifier 16 is coupled to the inverting input of the fourth operational amplifier 16 by R8 and C4 connected in parallel, while the inverting output of the fourth operational amplifier 16 is coupled to the non-inverting input of the fourth operational amplifier 16 by R8 and C4 connected in parallel.

In a preferred implementation, R7=R8 and C3=C4.

The differential outputs of the third operational amplifier 14 (at the differential in-phase output signal $V_I$) are further coupled to the differential inputs of the first operational amplifier 10 through a feedback network formed by resistors R9a. Specifically, the non-inverting output of the third operational amplifier 14 is coupled to the non-inverting input of the first operational amplifier 10 by R9a, while the inverting output of the third operational amplifier 14 is coupled to the inverting input of the first operational amplifier 10 by R9a.

The differential outputs of the third operational amplifier 14 (at the differential in-phase output signal VI) are further cross-coupled to the differential inputs of the first operational amplifier 10 through a feedback network formed by resistors R9b. Specifically, the non-inverting output of the third operational amplifier 14 is coupled to the inverting input of the first operational amplifier 10 by R9b, while the inverting output of the third operational amplifier 14 is coupled to the non-inverting input of the first operational amplifier 10 by R9b.

The differential outputs of the fourth operational amplifier 16 (at the differential quadrature-phase output signal $V_Q$) are further coupled to the differential inputs of the second operational amplifier 12 through a feedback network formed resistors R10a. Specifically, the non-inverting output of the fourth operational amplifier 16 is coupled to the non-inverting input of the second operational amplifier 12 by R10a, while the inverting output of the fourth operational amplifier 16 is coupled to the inverting input of the second operational amplifier 12 by R10a.

The differential outputs of the fourth operational amplifier 16 (at the differential quadrature-phase output signal $V_Q$) are further cross-coupled to the differential inputs of the second operational amplifier 12 through a feedback network formed resistors R10b. Specifically, the non-inverting output of the fourth operational amplifier 16 is coupled to the inverting input of the second operational amplifier 12 by R10b, while the inverting output of the fourth operational amplifier 16 is coupled to the non-inverting input of the second operational amplifier 12 by R10b.

In a preferred implementation, R9a=R10a and R9b=R10b.

The differential outputs of the third operational amplifier 14 are further cross-coupled to the differential inputs of the fourth operational amplifier 16 by resistors R11. Specifically, the non-inverting output of the third operational amplifier 14 is coupled to the inverting input of the fourth operational amplifier 16 by R11, while the inverting output of the third operational amplifier 14 is coupled to the non-inverting input of the fourth operational amplifier 16 by R11.

The differential outputs of the fourth operational amplifier 16 are further coupled to the differential inputs of the third operational amplifier 14 by resistors R12. Specifically, the non-inverting output of the fourth operational amplifier 16 is coupled to the non-inverting input of the third operational amplifier 14 by R12, while the inverting output of the fourth operational amplifier 16 is coupled to the inverting input of the third operational amplifier 14 by R12.

In a preferred implementation, R11=R12.

The circuit of FIG. 5 implements the feedback resistance Rfb between the filter output V and the filter input I in each of the in-phase and quadrature-phase circuits using a negative resistor network. For example, in the in-phase circuit, the negative resistor network is formed by cross coupling two resistors R9a and two resistors R9b, while in the quadrature-phase circuit, the negative resistor network for the feedback resistance is formed by cross coupling two resistors R10a and two resistors R10b.

The DC gain of the FIG. 5 filter is given by:

$$Go = \frac{V}{I} = \frac{R9a * R9b}{R9b - R9a}$$

Figure 6:
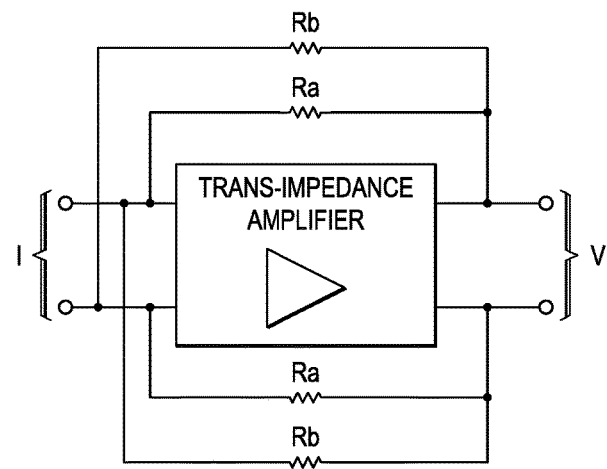
FIG. 6 is a generalized representation of the solution shown in detail in FIG. 5.

FIG. 6 illustrates a generalized representation of the solution shown in detail in FIG. 5. The trans-impedance amplifier represents the circuitry of FIG. 6 except for the resistances R9a, R9b, R10a, R10b. The feedback resistors Ra and Rb define the gain of the circuit. In order to simplify the discussion, a real filter is considered in FIG. 6.

Using this differential circuitry with a negative resistance feedback technique, it is possible to realize a 1.26 MΩ feedback resistance using two resistors Ra and Rb each of around 100 kΩ. This will provide the desired gain, but at a significant reduction in occupied area.

However, this solution does have limitations. For example, the boost of the gain and the area reduction are limited by the condition:

$Rb-Ra>0$

Indeed, it is necessary to make the denominator of the foregoing gain expression to be not negative. Furthermore, this condition has to be guaranteed with mismatch variations. The maximum boost from this solution is:

$$Rb - Ra \to Rb - \Delta Rb - (Ra + \Delta Ra) =$$
$$Rb - rRb - Ra - rRa = Rb(1-r) - Ra(1+r)$$
$$Rb > \frac{1+r}{1-r} Ra$$

For a given CMOS technology the expected mismatch variation may be 1%, then:

$$\frac{\Delta R}{R} = 1\% \to G\max = \frac{rR(R + \Delta R)}{R + \Delta R - R} \cong \frac{2R}{\Delta R/R} = \frac{Go}{\Delta R/R}$$

So, a 1% mismatch will result in a 50 times boost in the gain and a 50 times reduction of area.

Figure 1:
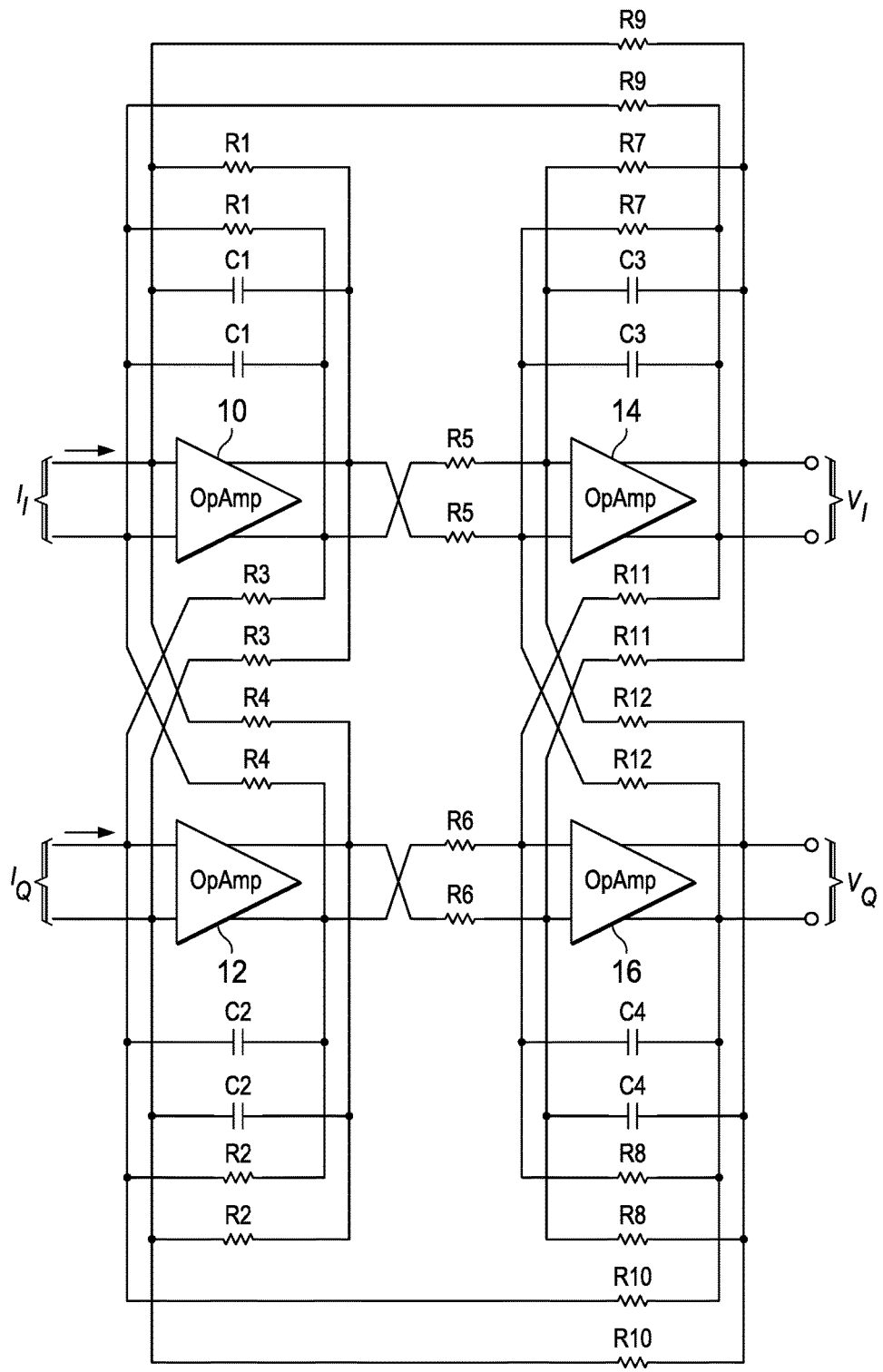
FIG. 1 is a circuit diagram for a second order complex band-pass filter circuit.
Figure 2A:
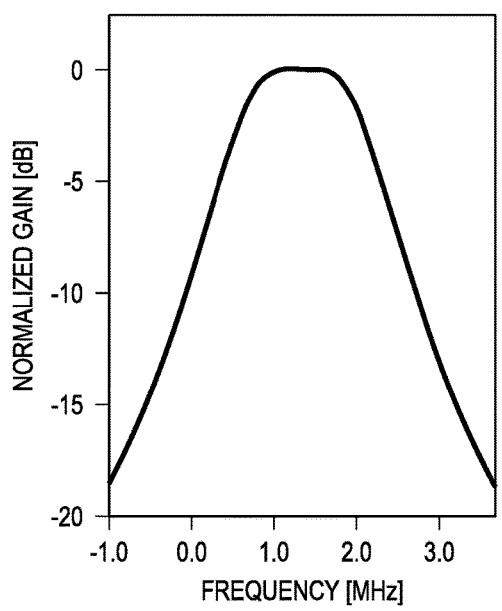
FIGS. 2A and 2B show the transfer function and group delay for an ideal filter.
Figure 2B:
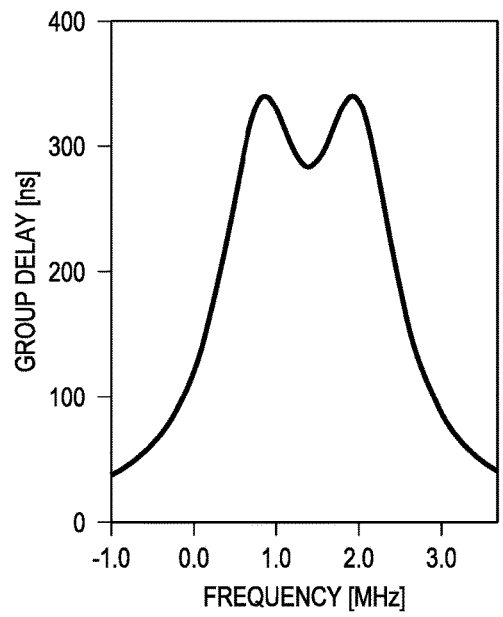
Figure 3A:
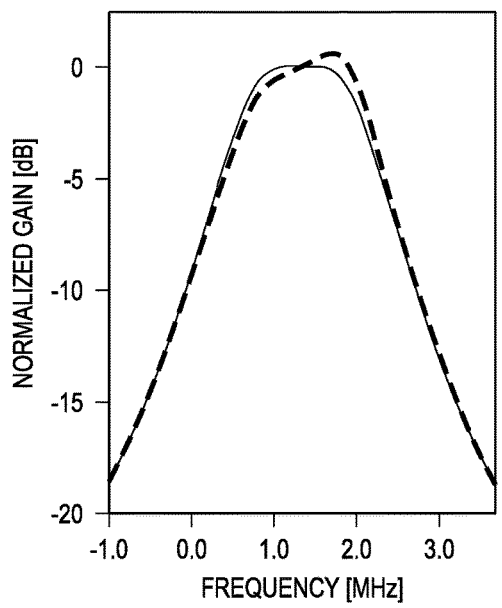
FIGS. 3A and 3B show the transfer function and group delay for a practical filter.
Figure 3B:
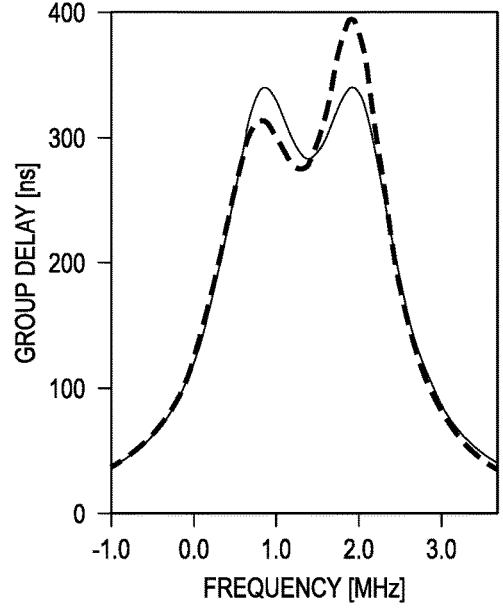
Figure 4:
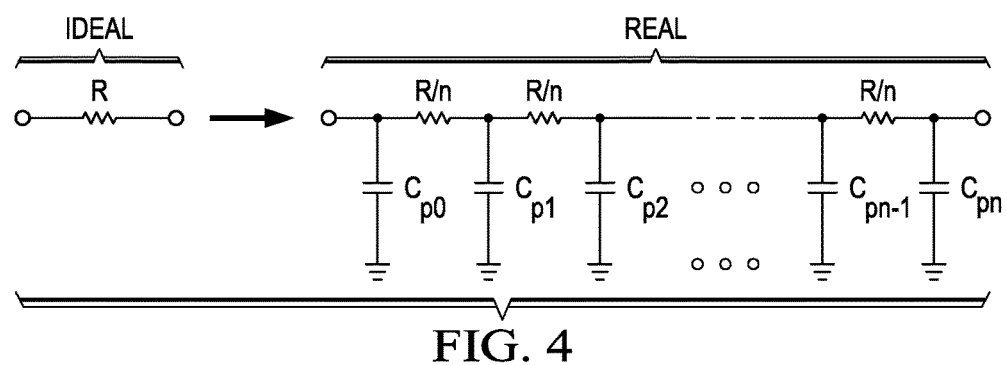
FIG. 4 shows the equivalent real circuit for a large value ideal resistor implemented as an integrated circuit.
Figure 7A:
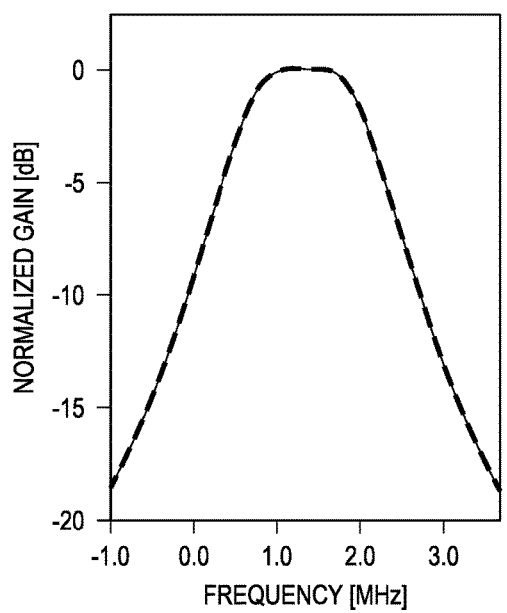
FIGS. 7A and 7B show the transfer function and group delay for the filter of FIG. 5.
Figure 7B:
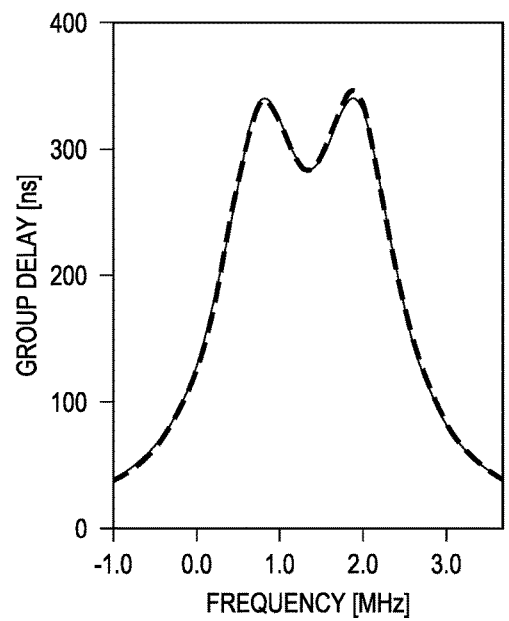

Reference is now made to FIGS. 7A and 7B showing the transfer function and group delay for the filter of FIG. 5. With comparison to the ideal response shown in FIGS. 2A and 2B, it will be noted that the filter of FIG. 5 presents a response substantially matching the ideal response, but with the advantage of integrated circuit implementation using smaller value resistors and less occupied surface area in comparison to the circuit of FIG. 1. Furthermore, the distortion shown in FIGS. 3A and 3B has been eliminated.

Although resistors are shown in the figures, it will be understood that any suitable impedance circuit could be used in place of the resistor circuit.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. A filter circuit, comprising:
a second-order bandpass filter circuit having a differential input comprising an inverting input and a non-inverting input and a differential output comprising an inverting output and a non-inverting output;
a first feedback network comprising a first impedance circuit coupled between the inverting output and the inverting input and a second impedance circuit coupled between the inverting output and the non-inverting input; and
a second feedback network comprising a third impedance circuit coupled between the non-inverting output and the non-inverting input and a fourth impedance circuit coupled between the non-inverting output and the inverting input; and
wherein the second-order complex bandpass filter circuit is a leapfrog filter topology.

2. The filter circuit of claim 1, wherein the first and third impedance circuits have equal impedance values.

3. The filter circuit of claim 1, wherein the second and fourth impedance circuits have equal impedance values.

4. The filter circuit of claim 1, wherein the first and third impedance circuits have a first impedance value and the second and fourth impedance circuits have a second impedance value, said second impedance value being different from the first impedance value.

5. The filter circuit of claim 4, wherein the second impedance value is greater than the first impedance value.

6. A filter circuit, comprising:
an in-phase differential input comprising a first inverting input and a first non-inverting input;
an in-phase differential output comprising a first inverting output and a first non-inverting output;
a quadrature-phase differential input comprising a second inverting input and a second non-inverting input;
a quadrature-phase differential output comprising a second inverting output and a second non-inverting output;
second-order complex bandpass filter circuitry coupled between the in-phase and quadrature-phase differential inputs and the in-phase and quadrature-phase differential outputs;
a first feedback network comprising:
a first resistor coupled between the first inverting output and the first inverting input;
a second resistor coupled between the first inverting output and the first non-inverting input;
a third resistor coupled between the first non-inverting output and the first non-inverting input; and
a fourth resistor coupled between the first non-inverting output and the first inverting input; and
a second feedback network comprising:
a fifth resistor coupled between the second inverting output and the second inverting input;
a sixth resistor coupled between the second inverting output and the second non-inverting input;
a seventh resistor coupled between the second non-inverting output and the second non-inverting input; and
an eighth resistor coupled between the second non-inverting output and the second inverting input.

7. The filter circuit of claim 6, wherein the first, third, fifth and seventh resistors have equal resistance values.

8. The filter circuit of claim 6, wherein the second, fourth, sixth and eighth resistors have equal resistance values.

9. The filter circuit of claim 6, wherein the first, third, fifth and seventh resistors have a first resistance value and the second, fourth, sixth and eighth resistors have a second resistance value, said second resistance value being different from the first resistance value.

10. The filter circuit of claim 9, wherein the second resistance value is greater than the first resistance value.

11. The filter circuit of claim 6, wherein the second-order complex bandpass filter circuit is a leapfrog filter topology.

12. A filter circuit, comprising:
a differential input comprising an inverting input and a non-inverting input;
a differential output comprising an inverting output and a non-inverting output;
second-order complex bandpass filter circuitry coupled between the differential input and the differential output; and
a feedback network comprising:
a first resistor coupled between the inverting output and the inverting input;
a second resistor coupled between the inverting output and the non-inverting input;
a third resistor coupled between the non-inverting output and the non-inverting input; and
a fourth resistor coupled between the non-inverting output and the inverting input;
wherein the second-order complex bandpass filter circuit is a leapfrog filter topology.

13. The filter circuit of claim 12, wherein the differential input is an in-phase differential input and the differential output is an in-phase differential output.

14. The filter circuit of claim 12, wherein the differential input is a quadrature-phase differential input and the differential output is a quadrature-phase differential output.

15. The filter circuit of claim 12, wherein the first and third resistors have equal resistance values.

16. The filter circuit of claim 12, wherein the second and fourth resistors have equal resistance values.

17. The filter circuit of claim 12, wherein the first and third resistors have a first resistance value and the second and fourth resistors have a second resistance value, said second resistance value being different from the first resistance value.

18. The filter circuit of claim 17, wherein the second resistance value is greater than the first resistance value.

19. A filter circuit, comprising:
a second-order bandpass filter circuit having a differential input comprising an inverting input and a non-inverting input and a differential output comprising an inverting output and a non-inverting output;
a first feedback network comprising a first impedance circuit coupled between the inverting output and the inverting input and a second impedance circuit coupled between the inverting output and the non-inverting input; and
a second feedback network comprising a third impedance circuit coupled between the non-inverting output and the non-inverting input and a fourth impedance circuit coupled between the non-inverting output and the inverting input; and wherein the second-order bandpass filter circuit comprises a first operational amplifier having differential inputs at the inverting input and the non-inverting input and a second operational amplifier having differential outputs at the inverting output and the non-inverting output, wherein differential outputs of the first operational amplifier are coupled to differential inputs of the second operational amplifier.

20. The filter circuit of claim 19, wherein the first and third impedance circuits have equal impedance values.

21. The filter circuit of claim 19, wherein the second and fourth impedance circuits have equal impedance values.

22. The filter circuit of claim 19, wherein the first and third impedance circuits have a first impedance value and the second and fourth impedance circuits have a second impedance value, said second impedance value being different from the first impedance value.

23. The filter circuit of claim 22, wherein the second impedance value is greater than the first impedance value.

* * * * *